(12) United States Patent
Cho

(10) Patent No.: US 8,536,591 B2
(45) Date of Patent: Sep. 17, 2013

(54) LIGHT EMITTING DEVICE AND LIGHTING SYSTEM

(75) Inventor: JHyun Kyong Cho, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 16 days.

(21) Appl. No.: 13/252,497

(22) Filed: Oct. 4, 2011

(65) Prior Publication Data

US 2012/0086043 A1 Apr. 12, 2012

(30) Foreign Application Priority Data

Oct. 6, 2010 (KR) .................. 10-2010-0097280

(51) Int. Cl.
*H01L 33/32* (2010.01)
*H01L 31/173* (2006.01)
*H01L 33/62* (2010.01)

(52) U.S. Cl.
USPC .............. 257/88; 257/13; 257/79; 257/80; 257/81

(58) Field of Classification Search
USPC ............ 257/13, 79–103, 918; 438/22–47, 438/69, 503, 507, 956
See application file for complete search history.

(56) References Cited

U.S. PATENT DOCUMENTS

| 7,192,163 | B2* | 3/2007 | Park ............................ 362/294 |
| 8,039,850 | B2* | 10/2011 | Lee et al. ....................... 257/88 |
| 2005/0001222 | A1* | 1/2005 | Kurahashi et al. .............. 257/94 |
| 2005/0084994 | A1* | 4/2005 | Yamazaki et al. .............. 438/29 |
| 2007/0284602 | A1* | 12/2007 | Chitnis et al. ................... 257/98 |
| 2008/0018243 | A1* | 1/2008 | Ishiguro et al. ............... 313/506 |
| 2008/0023691 | A1* | 1/2008 | Jang et al. ....................... 257/13 |
| 2008/0164809 | A1* | 7/2008 | Matsunami et al. .......... 313/504 |

* cited by examiner

*Primary Examiner* — Julio J Maldonado
*Assistant Examiner* — Moin Rahman
(74) *Attorney, Agent, or Firm* — KED & Associates, LLP

(57) ABSTRACT

A light emitting device may be provided that includes a conductive support member; a first conductive layer disposed on the conductive support member; a second conductive layer disposed on the first conductive layer; a light emitting structure including a second semiconductor layer formed on the second conductive layer, an active layer formed on the second semiconductor layer, a first semiconductor layer formed on the active layer and an insulation layer. The first conductive layer includes at least one via penetrating the second conductive layer, the second semiconductor layer and the active layer and projecting into a certain area of the first semiconductor layer. The first semiconductor layer includes an ohmic contact layer formed on or above the conductive via. The insulation layer is formed between the first conductive layer and the second conductive layer and is formed on the side wall of the via.

19 Claims, 5 Drawing Sheets

LIGHT EMITTING DEVICE AND LIGHTING SYSTEM

CROSS-REFERENCE TO RELATED APPLICATIONS

The present application claims priority under 35 U.S.C. §119(e) of Korean Patent Application No. 10-2010-0097280 filed on Oct. 6, 2010, which is hereby incorporated by reference in its entirety.

BACKGROUND

1. Field

The present invention relates to a light emitting device and a lighting system.

2. Background

A light emitting diode (LED) is a semiconductor element for converting electric energy into light. As compared with existing light sources such as a fluorescent lamp and an incandescent electric lamp and so on, the LED has advantages of low power consumption, a semi-permanent span of life, a rapid response speed, safety and an environment-friendliness. For this reason, many researches are devoted to substitution of the existing light sources with the LED. The LED is now increasingly used as a light source for lighting devices, for example, various lamps used interiorly and exteriorly, a liquid crystal display device, an electric sign and a street lamp and the like.

FIGS. 1 and 2 are cross sectional views showing the schematic configurations of prior vertical type light emitting devices.

First, referring to FIG. 1, a prior light emitting device 100 includes a substrate 110, a p-type conductive layer 120, a p-type semiconductor layer 130, an active layer 140, an n-type semiconductor layer 150 and an n-type electrode pad 160.

Regarding the light emitting device 100 shown in FIG. 1, light which is generated from the active layer 140 and is outward emitted is partially blocked by the uppermost n-type electrode pad 160. Therefore, the light emitting device 100 has low light emission efficiency.

Next, referring to FIG. 2, a prior light emitting device 200 includes a substrate 210, an n-type conductive layer 220, an insulation layer 230, a p-type conductive layer 240, a p-type semiconductor layer 250, an active layer 260, an n-type semiconductor layer 270 and an n-type electrode pad 241. The n-type conductive layer 220 includes conductive vias 220a, 220b and 220c penetrating the p-type conductive layer 240, the p-type semiconductor layer 250 and the active layer 260 and contacting with the n-type semiconductor layer 270.

Unlike the light emitting device 100 shown in FIG. 1, the upper portion of the light emitting device 200 shown in FIG. 2 is not blocked by an electrode, so that the light emitting device 200 has light-extraction efficiency higher than that of a prior light emitting device.

However, the insulation layer 230 is formed in the areas of the conductive vias 220a, 220b and 220c, which project into the n-type semiconductor layer 270. This causes a contact area between the n-type conductive layer 220 and the n-type semiconductor layer 270 to be decreased. The sloping surfaces of the conductive vias 220a, 220b and 220c increase with the increases of the depths of the conductive vias 220a, 220b and 220c, so that a contact area between the n-type semiconductor layer 270 and the conductive vias 220a, 220b and 220c is reduced. For this reason, the prior light emitting device having a via electrode shape has limited light-extraction efficiency.

SUMMARY

One embodiment is a light emitting device. The light emitting device includes: a conductive support member; a first conductive layer disposed on the conductive support member; a second conductive layer disposed on the first conductive layer; a light emitting structure including a first semiconductor layer placed over the second conductive layer, a second semiconductor layer placed between the first semiconductor layer and the second conductive layer and an active layer placed between the first semiconductor layer and the second semiconductor layer; and an insulation layer placed between the first conductive layer and the second conductive layer. The first conductive layer may include at least one via which penetrates the second conductive layer, the second semiconductor layer and the active layer and is disposed within the first semiconductor layer. The insulation layer may be disposed to extend along the side of the via. The first semiconductor layer may include an ohmic contact layer formed on or above the conductive via.

According to the embodiment, the ohmic contact layer may be an Al doped layer.

The ohmic contact layer may be an AlGaN layer.

BRIEF DESCRIPTION OF THE DRAWINGS

Arrangements and embodiments may be described in detail with reference to the following drawings in which like reference numerals refer to like elements and wherein.

DETAILED DESCRIPTION

A thickness or a size of each layer may be magnified, omitted or schematically shown for the purpose of convenience and clearness of description. The size of each component may not necessarily mean its actual size.

It should be understood that when an element is referred to as being 'on' or "under" another element, it may be directly on/under the element, and/or one or more intervening elements may also be present. When an element is referred to as being 'on' or 'under', 'under the element' as well as 'on the element' may be included based on the element.

An embodiment may be described in detail with reference to the accompanying drawings.

First Embodiment

Figure 1:
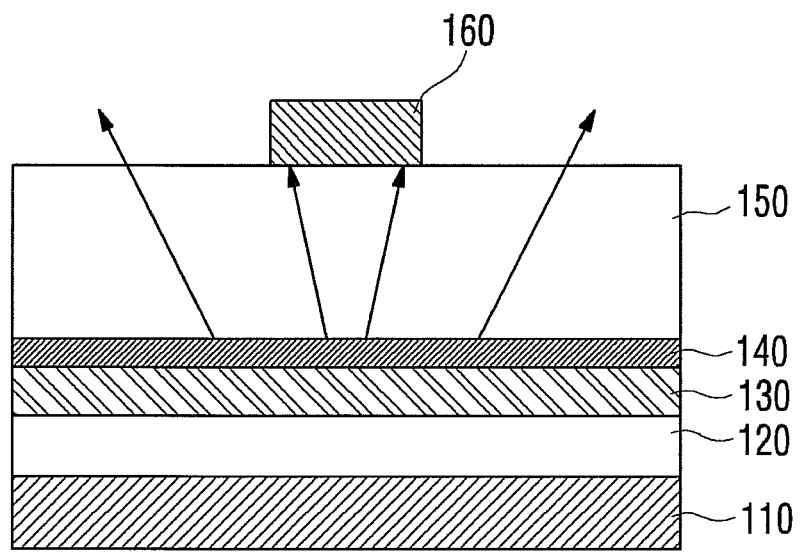
FIGS. 1 and 2 are cross sectional views showing the schematic configurations of prior vertical light emitting devices.
Figure 2:
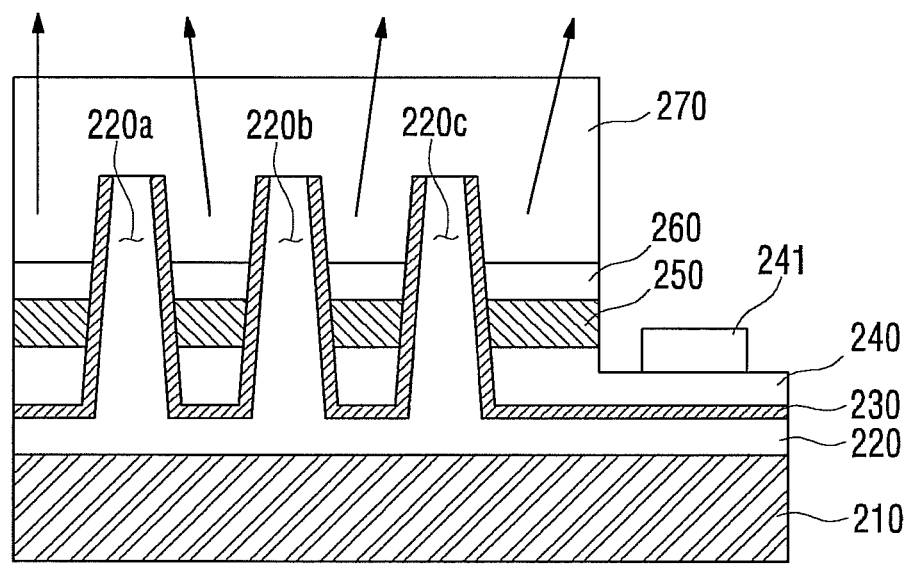
Figure 3A:
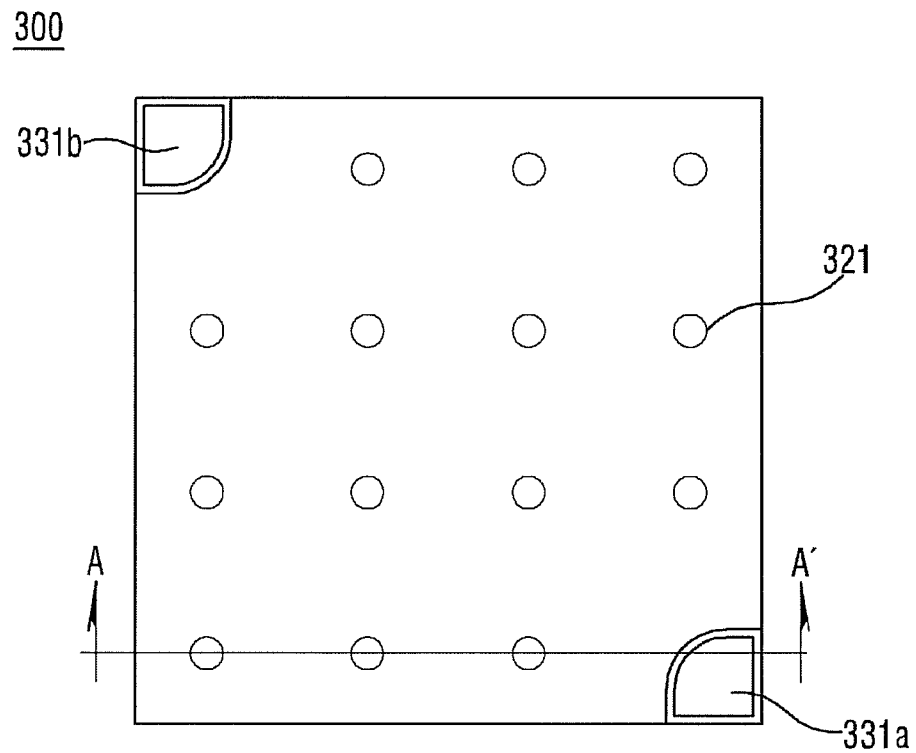
FIG. 3a is a view showing a top surface of a light emitting device according to a first embodiment of the present invention.

FIG. 3a is a view showing a top surface of a light emitting device 300 according to a first embodiment of the present invention.

Figure 3B:
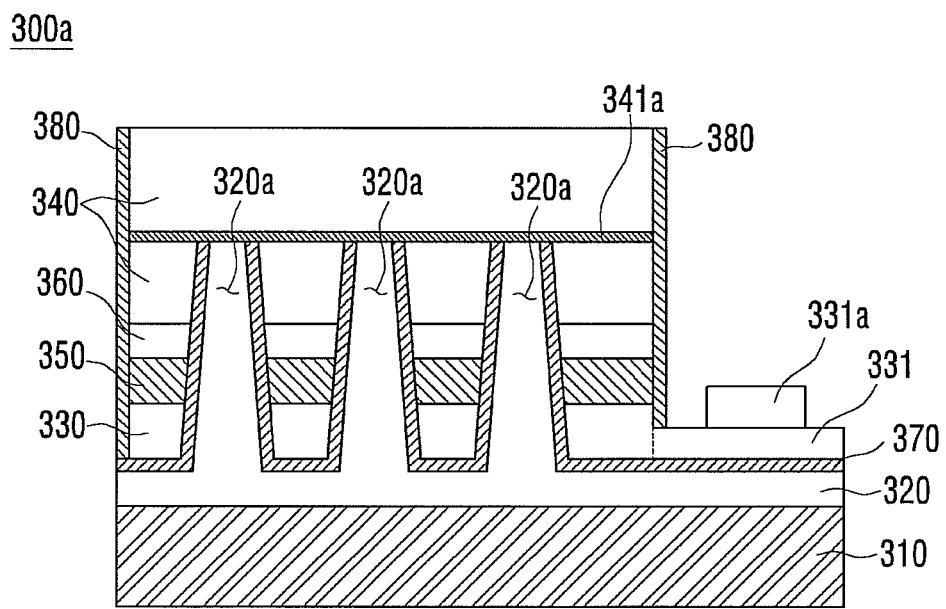
FIGS. 3b and 3c are cross sectional views schematically showing a configuration of the light emitting device according to a first embodiment of the present invention.
Figure 3C:
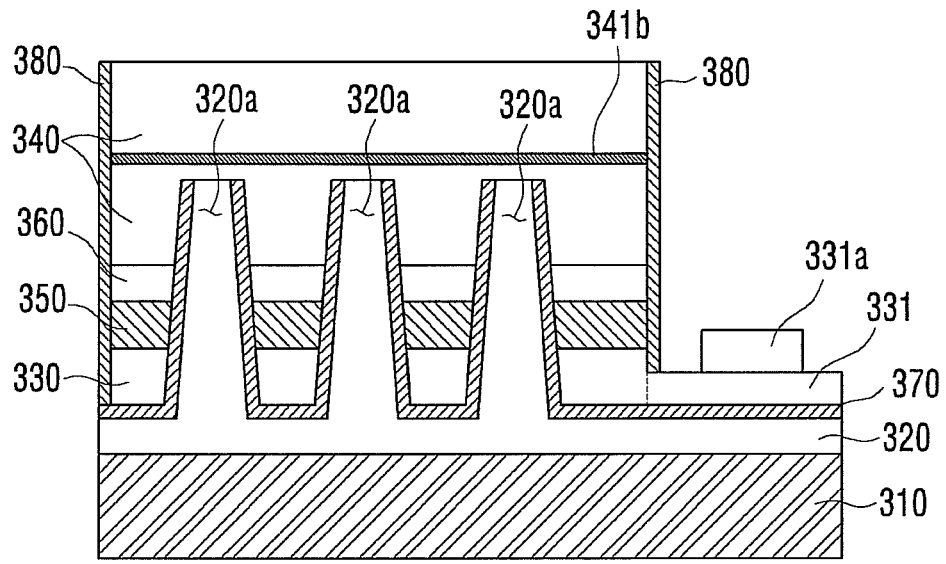

FIGS. 3b and 3c are cross sectional views schematically showing configurations of light emitting devices 300a and 300b according to a first embodiment of the present invention. FIGS. 3b and 3c are cross sectional views of the light emitting devices 300a and 300b taken along line A-A' of FIG. 3a.

First, referring to FIGS. 3b and 3c, the light emitting devices 300a and 300b according to the first embodiment of the present invention include a conductive support member 310, a first conductive layer 320, a second conductive layer 330, a light emitting structure including a first semiconductor layer 340 placed over the second conductive layer 330, a second semiconductor layer 350 placed between the first semiconductor layer 340 and the second conductive layer 330 and an active layer 360 placed between the first semiconductor layer 340 and the second semiconductor layer 350, an electrode pad 331a, Al doping layers 341a and 341b, an insulation layer 370 and a passivation layer 380.

Hereafter, for convenience of description, it is assumed that the first conductive layer 320 is an n-type conductive layer, the second conductive layer 330 is a p-type conductive layer, the electrode pad 331a is a p-type electrode pad, the first semiconductor layer 340 is an n-type semiconductor layer, and the second semiconductor layer 350 is a p-type semiconductor layer.

The conductive support member 310 may be formed including at least one of Au, Ni, Al, Cu, W, Si, Se and GaAs. For example, the conductive support member 310 may be made of a metal alloy of Si and Al.

The n-type conductive layer 320 may include a conductive layer formed on the conductive support member 310, and a plurality of conductive vias 320a connected with each other by the conductive layer. The n-type conductive layer 320 may be formed including at least one of Ag, Al, Au, Pt, Ti, Cr and W.

As shown in FIGS. 3b and 3c, the conductive via 320a may be formed to penetrate the n-type conductive layer 320, the p-type conductive layer 330, the p-type semiconductor layer 350 and the active layer 360, and to project into a certain area of the n-type semiconductor layer 340.

The insulation layer 370 may be formed such that the n-type conductive layer 320 is electrically insulated from the layers except for the conductive support member 310 and the n-type semiconductor layer 340. More specifically, the insulation layer 370 is formed between the n-type conductive layer 320 and the p-type conductive layer 330 and formed on the side walls of the plurality of conductive vias 320a, so that the n-type conductive layer 320 can be electrically insulated from the p-type conductive layer 330, the p-type semiconductor layer 350 and the active layer 360. The insulation layer 370 may be formed including at least one of silicon oxide ($SiO_2$), silicon nitride ($SiO_xN_y$, $Si_xN_y$), $Al_2O_3$ and fluoride based compound.

The p-type conductive layer 330 may be formed on the insulation layer 370. The p-type conductive layer 330 does not exist in the areas which the conductive via 320a penetrates.

The p-type conductive layer 330 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO, Pt, Ni, Au, Rh, Pd, Ag, Al, Ir. This intends to minimize the contact resistance of the p-type semiconductor layer 350 because the p-type conductive layer 330 electrically contacts with the p-type semiconductor layer 350. This also intends to improve light emission efficiency by reflecting outward light generated from the active layer 360.

The p-type conductive layer 330 may include at least one exposed area 331 of the interface on which the p-type conductive layer 330 contacts with the p-type semiconductor layer 350. On the exposed area, the p-type electrode pad 331a may be formed in order to connect an external power supply to the p-type conductive layer 330. On the exposed area 331, the p-type semiconductor layer 350, the active layer 360 and the n-type semiconductor layer 340 are not formed. The p-type electrode pad 331a may be formed in the corners of the light emitting devices 300a and 300b. This intends to maximize the light emitting areas of the light emitting devices 300a and 300b.

The p-type semiconductor layer 350 may be formed on the p-type conductive layer 330. The active layer 360 may be formed on the p-type semiconductor layer 350. The n-type semiconductor layer 340 may be formed on the active layer 360. The p-type semiconductor layer 350 and the active layer 360 do not exist in the areas which the conductive via 320a penetrates.

The n-type semiconductor layer 340 may be formed of a semiconductor material having an empirical formula of $In_xAl_yGa_{(1-x-y)}N$ ($0 \leq x \leq 1$, $0 \leq y \leq 1$, $0 \leq x+y \leq 1$), for example, InAlGaN, GaN, AlGaN, InGaN, AlInN, AlN and InN and the like. An n-type dopant such as Si, Ge and Sn and the like may be doped in the n-type semiconductor layer 340.

The n-type semiconductor layer 340 may include the Al doping layers 341a and 341b formed on the conductive via 320a. The Al doping layer 341a is formed by doping an n-GaN semiconductor layer 340 with Al. When the amount of carrier (hole concentration) of the n-type semiconductor layer 340 is $1 \times 10^{17}$ $cm^{-3}$, this affects carrier concentration increase due to the Al doping and does not affect band gap. The Al doping layer 341a may be designated as an ohmic contact layer.

The Al doping layer 341a may be, as shown in FIG. 3b, formed on the top surface of the conductive via 320a. Otherwise, the Al doping layer 341b may be, as shown in FIG. 3c, formed above the conductive via 320a within the n-type semiconductor layer 340.

In order to improve ohmic characteristics of the top surface of the conductive via 320a, there is a method of reducing the width of a potential barrier formed on a contact surface between metal constituting the conductive via 320a and semiconductor constituting the n-type semiconductor layer 340. When the width of the potential barrier is reduced by using a method of increasing doping concentration, contact resistance is decreased due to electron tunneling and ohmic contact can be improved. As a result, the Al doping layers 341a and 341b concentrate carriers on the top surface of the conductive via 320a, so that the electron tunneling occurs more easily and the ohmic characteristics can be enhanced.

In the embodiment, the Al doping layer may be formed by doping a specific area of a GaN layer with Al material. An AlGaN layer to be described later in another embodiment may be formed by mixing Al and GaN in a certain ratio.

Meanwhile, the Al doping layer 341b is formed as shown in FIG. 3b, the top surface of the conductive via 320a may come in direct contact with the n-type semiconductor layer 340. Accordingly, the conductive support member 310 may be electrically connected with the n-type semiconductor layer 340 through the conductive via 320a. In this case, since the n-type conductive layer 320 is electrically connected with the conductive support member 310 and the n-type semiconductor layer 340, it is recommended that the n-type conductive layer 320 be formed of a material having minimal contact resistance with the conductive support member 310 and the n-type semiconductor layer 340.

The p-type semiconductor layer 350 may be formed of a semiconductor material having an empirical formula of $In_xAl_yGa_{(1-x-y)}N$ ($0 \leq x \leq 1$, $0 \leq y \leq 1$, $0 \leq x+y \leq 1$), for example, InAlGaN, GaN, AlGaN, InGaN, AlInN, AlN and InN and the like. A p-type dopant such as Mg and Zn and the like may be doped in the p-type semiconductor layer 350.

The active layer 360 may be formed of a semiconductor material having an empirical formula of $In_xAl_yGa_{(1-x-y)}N$ ($0 \leq x \leq 1$, $0 \leq y \leq 1$, $0 \leq x \leq y \leq 1$). When the active layer 360 is formed in a multiple quantum well (MQW) structure, the active layer 360 may be formed by stacking a plurality of well layers and a plurality of barrier layers, for example, at a cycle of InGaN well layer/GaN barrier layer.

The active layer 360 may be formed of another material in accordance with the materials constituting the n-type semiconductor layer 340 and the p-type semiconductor layer 350. In other words, the active layer 360 includes a layer which converts energy by the recombination of electrons and holes into light and emits the light. When the active layer 360 includes the well layers and the barrier layers, it is recommended that the active layer 360 should be formed such that an energy band gap of the well layer is smaller than that of the barrier layer.

Meanwhile, the active layer 360 exposed outward may function as a current leakage path during the working of the light emitting devices 300a and 300b. Here, such a problem is prevented by forming the passivation layer 380 on the side wall of the light emitting structure. The passivation layer 380 protects the light emitting structure, especially the active layer 360 from the outside and restrains a leakage current from flowing. The passivation layer 380 may be formed including at least any one of silicon oxide ($SiO_2$), silicon nitride ($SiO_xN_y$, $Si_xN_y$), metal oxide ($Al_2O_3$) and fluoride based compound.

Second Embodiment

Figure 4A:
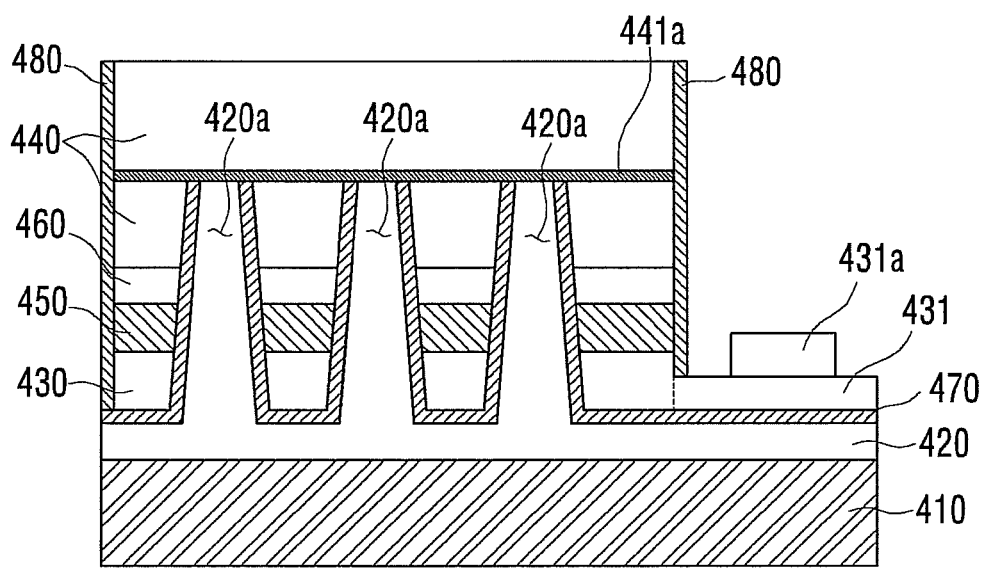
FIGS. 4a and 4b are cross sectional views schematically showing a configuration of a light emitting device according to a second embodiment of the present invention.
Figure 4B:
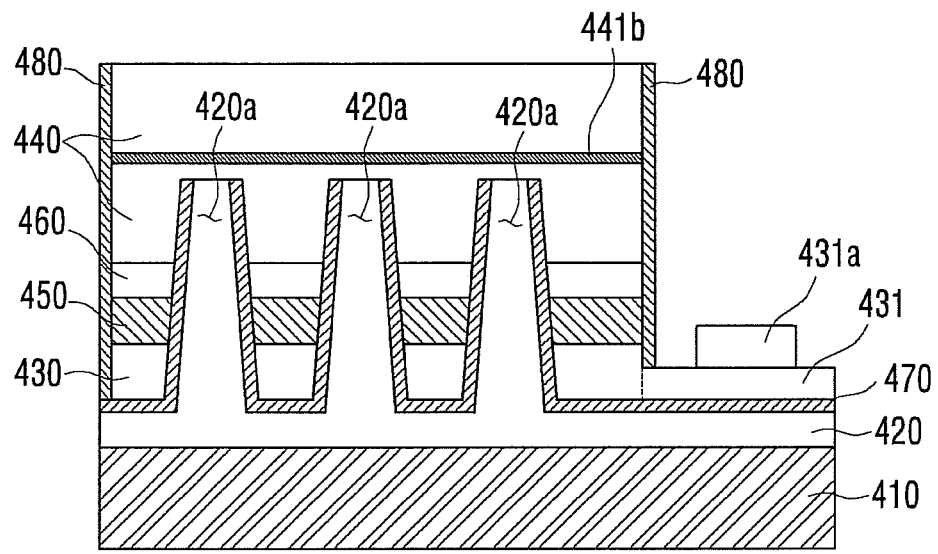

FIGS. 4a and 4b are cross sectional views schematically showing configurations of light emitting devices 400a and 400b according to a second embodiment of the present invention.

First, referring to FIGS. 4a and 4b, the light emitting devices 400a and 400b according to the second embodiment of the present invention include a conductive support member 410, a first conductive layer 420, a second conductive layer 430, a light emitting structure including a first semiconductor layer 440 placed over the second conductive layer 430, a second semiconductor layer 450 placed between the first semiconductor layer 440 and the second conductive layer 430 and an active layer 460 placed between the first semiconductor layer 440 and the second semiconductor layer 450, an electrode pad 431a, AlGaN layers 441a and 441b, an insulation layer 470 and a passivation layer 480.

Hereafter, for convenience of description, it is assumed that the first conductive layer 420 is an n-type conductive layer, the second conductive layer 430 is a p-type conductive layer, the electrode pad 431a is a p-type electrode pad, the first semiconductor layer 440 is an n-type semiconductor layer, and the second semiconductor layer 450 is a p-type semiconductor layer.

The conductive support member 410 may be formed including at least one of Au, Ni, Al, Cu, W, Si, Se and GaAs. For example, the conductive support member 310 may be made of a metal alloy of Si and Al.

The n-type conductive layer 420 may include a conductive layer formed on the conductive support member 410, and a plurality of conductive vias 420a connected with each other by the conductive layer. The n-type conductive layer 420 may be formed including at least one of Ag, Al, Au, Pt, Ti, Cr and W.

As shown in FIGS. 4a and 4b, the conductive via 420a may be formed to penetrate the n-type conductive layer 420, the p-type conductive layer 430, the p-type semiconductor layer 450 and the active layer 460, and to project into a certain area of the n-type semiconductor layer 440.

The insulation layer 470 may be formed such that the n-type conductive layer 420 is electrically insulated from the layers except for the conductive support member 410 and the n-type semiconductor layer 440. More specifically, the insulation layer 470 is formed between the n-type conductive layer 420 and the p-type conductive layer 430 and formed on the side walls of the plurality of conductive vias 420a, so that the n-type conductive layer 420 can be electrically insulated from the p-type conductive layer 430, the p-type semiconductor layer 450 and the active layer 460. The insulation layer 470 may be formed including at least one of silicon oxide ($SiO_2$), silicon nitride ($SiO_xN_y$, $Si_xN_y$), $Al_2O_3$ and fluoride based compound.

The p-type conductive layer 430 may be formed on the insulation layer 470. The p-type conductive layer 430 does not exist in the areas which the conductive via 420a penetrates.

The p-type conductive layer 430 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOX/ITO, Ni/IrOx/Au, and Ni/IrOx/Au/ITO, Pt, Ni, Au, Rh, Pd, Ag, Al, Ir. This intends to minimize the contact resistance of the p-type semiconductor layer 450 because the p-type conductive layer 430 electrically contacts with the p-type semiconductor layer 450. This also intends to improve light emission efficiency by reflecting outward light generated from the active layer 460.

The p-type conductive layer 430 may include at least one exposed area 431 of the interface on which the p-type conductive layer 430 contacts with the p-type semiconductor layer 450. On the exposed area, the p-type electrode pad 431a may be formed in order to connect an external power supply to the p-type conductive layer 430. On the exposed area 431, the p-type semiconductor layer 450, the active layer 460 and the n-type semiconductor layer 440 are not formed. The p-type electrode pad 431a may be formed in the corners of the light emitting devices 400a and 400b. This intends to maximize the light emitting areas of the light emitting devices 400a and 400b.

The p-type semiconductor layer 450 may be formed on the p-type conductive layer 430. The active layer 460 may be formed on the p-type semiconductor layer 450. The n-type semiconductor layer 440 may be formed on the active layer 460. The p-type semiconductor layer 450 and the active layer 460 do not exist in the areas which the conductive via 420a penetrates.

The n-type semiconductor layer 440 may be formed of a semiconductor material having an empirical formula of $In_xAl_yGa_{(1-x-y)}N$ ($0 \leq x \leq 1$, $0 \leq y \leq 1$, $0 \leq x+y \leq 1$), for example, InAlGaN, GaN, AlGaN, InGaN, AlInN, AlN and InN and the like. An n-type dopant such as Si, Ge and Sn and the like may be doped in the n-type semiconductor layer 340.

The n-type semiconductor layer 440 may include the AlGaN layers 441a and 441b formed on the conductive via 420a. The AlGaN layer 441a may be, as shown in FIG. 4a, formed on the top surface of the conductive via 420a. Otherwise, the AlGaN layer 441b may be, as shown in FIG. 4b, formed above the conductive via 420a within the n-type semiconductor layer 440. The AlGaN layers 441a and 441b may be formed by growing a cap layer on an n-GaN semiconductor layer 440. The AlGaN layers 441a and 441b have an empirical formula of $Al_xGa(1-x)N$ ($0 \leq x \leq 1$), influences a mole fraction of group III element in accordance with the amount of Al, and gives variety to band gap depending on the influence. The AlGaN layer 441a may be designated as an ohmic contact layer.

The AlGaN layers 441a and 441b as a material, which belongs to the same group as that of the n-GaN semiconductor layer 440 and has a band gap different from that of the n-GaN semiconductor layer 440, reduce a depletion region between the conductive via 420a and the n-GaN semiconductor layer 440 or lower a surface Schottky barrier between the conductive via 420a and the n-GaN semiconductor layer 440 by causing spontaneous polarization and piezoelectric polarization. As a result, ohmic characteristic can be improved.

Meanwhile, the AlGaN layer 441a is formed as shown in FIG. 4b, the top surface of the conductive via 420a may come in direct contact with the n-type semiconductor layer 440. Accordingly, the conductive support member 410 may be electrically connected with the n-type semiconductor layer 440 through the conductive via 420a. In this case, since the n-type conductive layer 420 is electrically connected with the conductive support member 410 and the n-type semiconductor layer 440, it is recommended that the n-type conductive layer 420 be formed of a material having minimal contact resistance with the conductive support member 410 and the n-type semiconductor layer 440.

The p-type semiconductor layer 450 may be formed of a semiconductor material having an empirical formula of $In_xAl_yGa_{(1-x-y)}N$ ($0 \leq x \leq 1$, $0 \leq y \leq 1$, $0 \leq x+y \leq 1$), for example, InAlGaN, GaN, AlGaN, InGaN, AlInN, AlN and InN and the like. A p-type dopant such as Mg and Zn and the like may be doped in the p-type semiconductor layer 450.

The active layer 460 may be formed of a semiconductor material having an empirical formula of $In_xAl_yGa_{(1-x-y)}N$ ($0 \leq x \leq 1$, $0 \leq y \leq 1$, $0 \leq x+y \leq 1$). When the active layer 460 is formed in a multiple quantum well (MQW) structure, the active layer 460 may be formed by stacking a plurality of well layers and a plurality of barrier layers, for example, at a cycle of InGaN well layer/GaN barrier layer.

The active layer 460 may be formed of another material in accordance with the materials constituting the n-type semiconductor layer 340 and the p-type semiconductor layer 450. In other words, the active layer 460 converts energy by the recombination of electrons and holes into light and emits. Therefore, it is recommended that the active layer 460 be formed of a material having an energy band gap smaller than those of the n-type semiconductor layer 440 and the p-type semiconductor layer 450.

Meanwhile, the active layer 460 exposed outward may function as a current leakage path during the working of the light emitting devices 400a and 400b. Here, such a problem is prevented by forming the passivation layer 480 on the side wall of the light emitting structure. The passivation layer 480 protects the light emitting structure, especially the active layer 460 from the outside and restrains a leakage current from flowing. The passivation layer 480 may be formed including at least any one of silicon oxide ($SiO_2$), silicon nitride ($SiO_xN_y$, $Si_xN_y$), metal oxide ($Al_2O_3$) and fluoride based compound.

[Light Emitting Device Package]

Figure 5:
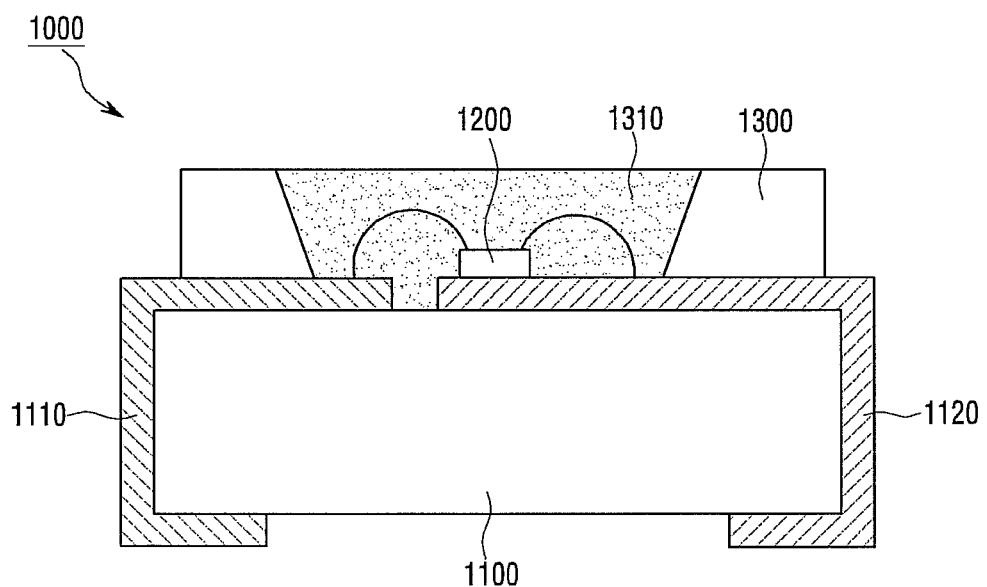
FIG. 5 is a view schematically showing a light emitting device package.

Hereafter, a light emitting device package according to an embodiment will be described with reference to FIG. 5. FIG. 5 is a cross sectional view showing schematically a light emitting device package 1000.

As shown in FIG. 5, the light emitting device package 1000 according to the embodiment includes a package body 1100, a first electrode layer 1110, a second electrode 1120, a light emitting device 1200 and a filler 1300.

The package body 1100 may be formed including a silicon material, a synthetic resin material or a metallic material. Inclined surfaces are formed around the light emitting device 1200, thereby improving the light-extraction efficiency.

The first electrode layer 1110 and the second electrode 1120 are disposed in the package body 1100. The first electrode layer 1110 and the second electrode 1120 are electrically isolated from each other and supply electric power to the light emitting device 1200. The first electrode layer 1110 and the second electrode 1120 are able to increase luminous efficiency by reflecting light generated from the light emitting device 1200. The first electrode layer 1110 and the second electrode 1120 can also exhaust heat generated from the light emitting device 1200.

The light emitting device 1200 is electrically connected to the first electrode layer 1110 and the second electrode 1120. The light emitting device 1200 may be disposed on the package body 1100 or may be disposed on either the first electrode layer 1110 or the second electrode 1120.

The light emitting device 1200 may be also electrically connected to the first electrode layer 1110 and the second electrode 1120 by any one of a wire bonding manner, a flip-chip manner or a die-bonding process.

The filler 1300 may be formed to surround and protect the light emitting device 1200. The filler 1300 includes a fluorescent material, so that the wavelength of light emitted from the light emitting device 1200 may be changed.

The light emitting device package 1000 is equipped with at least one or a plurality of the light emitting devices disclosed in the embodiments. There is no limited to the number of the light emitting devices.

A plurality of the light emitting device packages 1000 according to the embodiment may be arrayed on a substrate. An optical member such as a light guide plate, a prism sheet and a diffusion sheet and the like may be disposed on the optical path of the light emitting device package 1000. Such a light emitting device package 1000, the substrate and the optical member are able to function as a light unit.

Another embodiment can be implemented by a display device, a pointing device and a lighting device and the like, all of which include the semiconductor light emitting device or the light emitting device package which has been described in the aforementioned embodiments. For example, the lighting device may include a lamp and a street lamp.

[Lighting Device]

Figure 6:
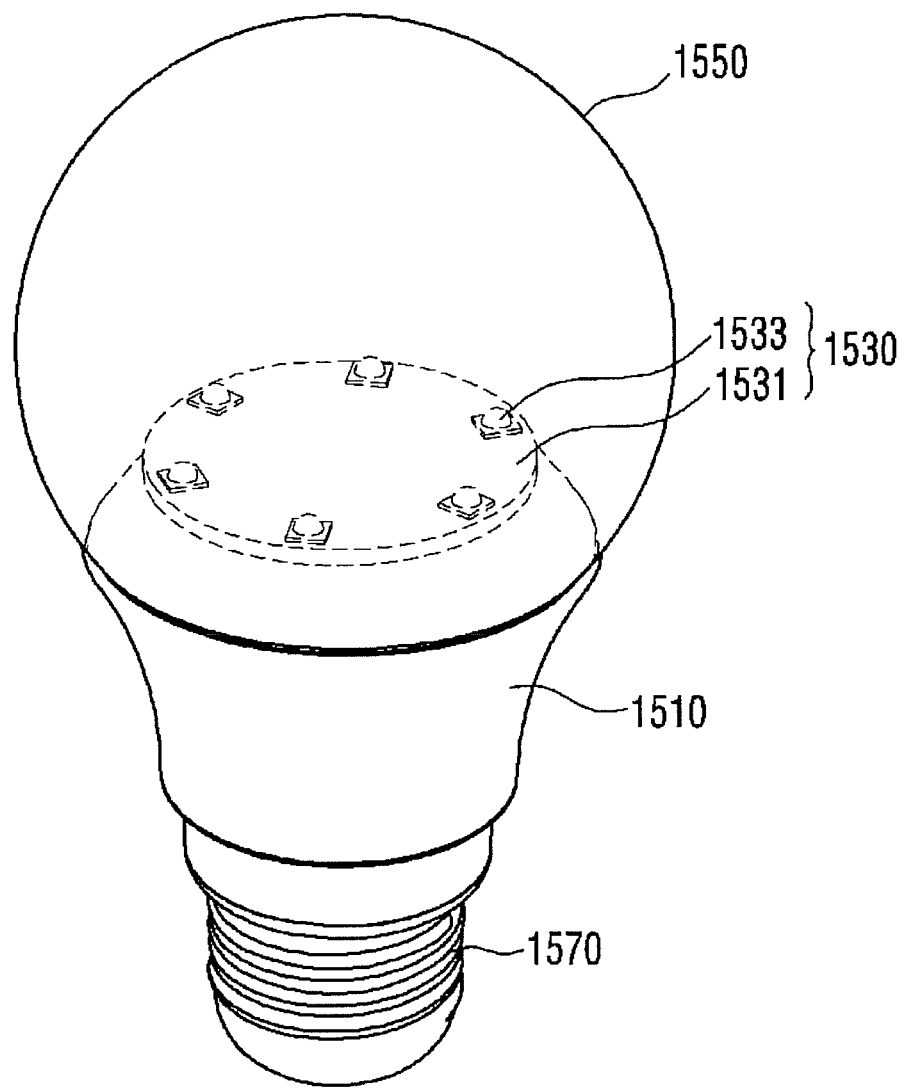
FIG. 6 is a view schematically showing a lighting device.

FIG. 6 is a perspective view showing a lighting device 1500 including the light emitting device package shown in FIG. 4.

Referring to FIG. 6, the lighting device 1500 may include a case 1510, a light emitting module 1530 disposed on the case 1510, a cover 1550 connected to the case 1510, and a connection terminal 1570 connected to the case 1510 and supplied with an electric power from an external power supply.

The case 1510 may be formed of a material having an excellent heat radiating characteristic, for example, a metal material or a resin material.

The light emitting module 1530 may include a board 1531 and at least one light emitting device package 1533 which is based on the embodiment and is mounted on the board 1531. The plurality of the light emitting device packages 1533 may be radially arranged apart from each other at a predetermined interval on the board 1531.

The board 1531 may be an insulating substrate on which a circuit pattern has been printed, and may include, for example, a printed circuit board (PCB), a metal core PCB, a flexible PCB, a ceramic PCB, an FR-4 substrate, etc.

Also, the board 1531 may be formed of a material capable of efficiently reflecting light. The surface of the board 1531 may have a color capable of efficiently reflecting light, such as white or silver.

The at least one light emitting device package 1533 may be disposed on the board 1531. Each of the light emitting device packages 1533 may include at least one light emitting diode (LED) chip. The LED chip may include both a LED emitting red, green, blue or white light and a UV LED emitting ultraviolet (UV).

The light emitting module 1530 may have various combinations of the light emitting device packages so as to obtain desired color and luminance. For example, the light emitting module 1530 may have a combination of a white LED, a red LED and a green LED in order to obtain a high color rendering index (CRI).

The connection terminal 1570 may be electrically connected to the light emitting module 1530 in order to supply power. The connection terminal 1570 may be screwed and connected to an external power in the form of a socket. However, there is no limit to the method for connecting the connection terminal 1570 to an external power. For example, the connection terminal 1570 may be made in the form of a pin and inserted into the external power, or may be connected to the external power through a power line.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a conductive support member;
   a first conductive layer disposed on the conductive support member;
   a second conductive layer disposed on the first conductive layer;
   a light emitting structure including a first semiconductor layer over the second conductive layer, a second semiconductor layer between the first semiconductor layer and the second conductive layer and an active layer between the first semiconductor layer and the second semiconductor layer; and
   an insulation layer between the first conductive layer and the second conductive layer,
   wherein the first conductive layer includes at least one via that penetrates the second conductive layer, the second semiconductor layer and the active layer, and the via is disposed within the first semiconductor layer,
   wherein the insulation layer is disposed to extend along a side of the via, and
   wherein the first semiconductor layer includes an ohmic contact layer formed on or above the via within the first semiconductor layer.

2. The light emitting device of claim 1, wherein the ohmic contact layer is an Al doped layer.

3. The light emitting device of claim 1, wherein the ohmic contact layer is an AlGaN layer.

4. The light emitting device of claim 1, further comprising a passivation layer formed on a side wall of the light emitting structure.

5. The light emitting device of claim 1, wherein the second conductive layer comprises at least one exposed area of surface forming an interface with the second semiconductor layer, and the light emitting device further comprises an electrode pad formed on the exposed area of the second conductive layer.

6. The light emitting device of claim 1, wherein the conductive support member comprises at least one of Au, Ni, Al, Cu, W, Si, Se and GaAs.

7. The light emitting device of claim 1, wherein the first conductive layer comprises at least one of Ag, Al, Au, Pt, Ti, Cr and W.

8. The light emitting device of claim 1, wherein the second conductive layer comprises at least one of Ag, Al, Pt, Ni, Pt, Pd, Au, Ir and a transparent conductive oxide, and wherein the transparent conductive oxide comprises at least one of ITO and GZO.

9. The light emitting device of claim 1, wherein an area of a top surface of the via is less than an area of a bottom surface of the via.

10. The light emitting device of claim 4, wherein the insulation layer and the passivation layer are respectively formed including at least any one of silicon oxide, silicon nitride, metal oxide and fluoride based compound.

11. The light emitting device of claim 1, wherein the active layer is formed by stacking a plurality of well layers and a plurality of barrier layers.

12. A light emitting device package comprising:
   a package body;
   a first electrode layer and a second electrode layer, all of which are disposed on the package body; and
   the light emitting device of claim 1, the light emitting device being electrically connected to the first electrode layer and the second electrode layer.

13. A lighting device comprising:
   a case;
   a light emitting module disposed within the case; and
   a connection terminal disposed within the case and electrically connected to the light emitting module in such a manner as to be supplied with an electric power from an external power supply, wherein the light emitting module includes the light emitting device package of claim 12.

14. A light emitting device comprising:

a conductive support member;

a first conductive layer on the conductive support member;

a second conductive layer on the first conductive layer, wherein the second conductive layer includes an exposed area;

a light emitting structure that includes a first semiconductor layer on the second conductive layer, a second semiconductor layer between the first semiconductor layer and the second conductive layer and an active layer between the first semiconductor layer and the second semiconductor layer; and an insulation layer between the first conductive layer and the second conductive layer, wherein the first conductive layer includes at least one via provided in the first semiconductor layer and that extends through the second conductive layer, the second semiconductor layer and the active layer, wherein a top area of the via within the first semiconductor layer is less than a bottom area of the via at the second conductive layer, wherein the insulation layer is provided along a side of the via, and wherein the first semiconductor layer includes an ohmic contact layer formed on the top area of the via provided within the first semiconductor layer.

15. The light emitting device of claim 14, wherein the ohmic contact layer is an Al doped layer.

16. The light emitting device of claim 14, wherein the ohmic contact layer is an AlGaN layer.

17. The light emitting device of claim 14, further comprising a passivation layer on a side wall of the light emitting structure.

18. A light emitting device package comprising:

a package body;

a first electrode layer and a second electrode layer on the package body; and the light emitting device of claim 14, wherein the light emitting device is electrically connected to the first electrode layer and the second electrode layer.

19. A lighting device comprising:

a case;

a light emitting module within the case; and a connection terminal within the case and being electrically connected to the light emitting module to be supplied with an electric power from an external power supply, wherein the light emitting module includes the light emitting device package of claim 18.

* * * * *